United States Patent
Purushothaman et al.

(10) Patent No.: US 10,340,899 B2
(45) Date of Patent: Jul. 2, 2019

(54) HIGH PERFORMANCE LOW RETENTION MODE LEAKAGE FLIP-FLOP

(71) Applicant: TEXAS INSTRUMENTS INCORPORATED, Dallas, TX (US)

(72) Inventors: Soman Purushothaman, Karnataka (IN); Keshav Bhaktavatson Chintamani, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/715,290

(22) Filed: Sep. 26, 2017

(65) Prior Publication Data

US 2018/0248541 A1  Aug. 30, 2018

(30) Foreign Application Priority Data

Feb. 28, 2017  (IN) .............................. 201741006980

(51) Int. Cl.
*H03K 3/037* (2006.01)
*H03K 3/356* (2006.01)
*H03K 3/3562* (2006.01)

(52) U.S. Cl.
CPC ......... *H03K 3/0375* (2013.01); *H03K 3/0372* (2013.01); *H03K 3/35625* (2013.01); *H03K 3/356008* (2013.01)

(58) Field of Classification Search
CPC ............................ H03K 3/0375; H03K 3/0372
See application file for complete search history.

(56) References Cited

U.S. PATENT DOCUMENTS

| | | | | |
|---|---|---|---|---|
| 8,339,172 B2* | 12/2012 | Firmin | .................. | H03K 3/0372 327/202 |
| 9,178,496 B2* | 11/2015 | Vilangudipitchai | ... | H03K 3/012 |
| 2003/0188241 A1* | 10/2003 | Zyuban | ............ | G01R 31/31721 714/726 |
| 2006/0220700 A1* | 10/2006 | Hoover | .................. | H03K 3/012 327/108 |
| 2007/0085585 A1* | 4/2007 | Frederick | ......... | H03K 3/356008 327/218 |
| 2009/0058484 A1* | 3/2009 | Rao | ........................ | H03K 3/012 327/202 |
| 2010/0001774 A1* | 1/2010 | Djaja | ..................... | H03K 3/012 327/202 |

(Continued)

*Primary Examiner* — Thomas J. Hiltunen
(74) *Attorney, Agent, or Firm* — Kenneth Liu; Charles A. Brill; Frank D. Cimino

(57) ABSTRACT

This invention is a retention circuit retaining the state of a circuit node driven by a primary drive circuit. This circuit includes cross coupled first and second inverters and a transmission gate. The transmission gate receives a retention mode signal and isolates the retention circuit and the circuit node when a retention mode is active and connects the retention circuit and the circuit node when the retention mode is inactive. In the preferred embodiment the primary drive circuit is constructed of transistors having a standard voltage threshold and the retention circuit is constructed of transistors having a high voltage threshold greater than said standard voltage threshold. A tristate inverter isolates the retention circuit from the circuit node when not in retention mode and supplies an inverse of a signal from output of said first inverter when in retention mode.

17 Claims, 2 Drawing Sheets

(56) References Cited

U.S. PATENT DOCUMENTS

| | | | |
|---|---|---|---|
| 2011/0248759 A1* | 10/2011 | Chi | H03K 3/356008 327/202 |
| 2011/0298517 A1* | 12/2011 | Pal | H03K 3/012 327/202 |
| 2013/0088272 A1* | 4/2013 | Veggetti | H03K 3/0375 327/198 |
| 2015/0188519 A1* | 7/2015 | Singhal | H03K 19/0013 327/199 |
| 2018/0083603 A1* | 3/2018 | Urard | H03K 3/012 |

* cited by examiner

HIGH PERFORMANCE LOW RETENTION MODE LEAKAGE FLIP-FLOP

CLAIM OF PRIORITY

This application claims priority under 35 U.S.C 119(e)(1) to Indian Patent Application No. 201740116980 filed Feb. 28, 2017.

TECHNICAL FIELD OF THE INVENTION

The technical field of this invention is digital circuits incorporating retention flip-flops and control of leakage current in these retention flip flops.

BACKGROUND OF THE INVENTION

Retention flip-flops are used to retain or keep a state on a circuit line without the need to continuously power and clock the generating circuit. Some digital circuit types that perform logic operations (AND, OR, etc.) require continued power to perform the logic operation. To achieve the computing goals, these circuit types need fast ON/OFF switching times often driving large loads. These goals are typically achieved employing relatively large transistors capable of switching large currents. It is typical to store the digital states of these logic operations in a register flip-flop. In ordinary operation these flip-flops must also drive large loads requiring relatively large transistors.

Retention of an achieved state involves differing considerations. Once a line is switched to a new state the current needed to retain that state is much less than the current needed to quickly achieve the state. Digital circuits often spend more time retaining an achieved state than switching. The electric power requirements of portable, battery powered equipment make reduced power consumption advantageous. If the electronic circuit consume less power, either the battery size can be reduced while retaining the same operating life or the same battery size promotes longer device operating life. This reduced power consumption quest has led to the use of retention flip-flops.

Retention flip-flops are employed to keep or hold the state of a circuit line after switching is completed by the primary circuit. The electrical power required to retain a circuit state is less than the electrical power required to switch to that state. Thus a retention flip-flop keeps the circuit line state while the primary circuit, which uses more electrical power, is switched OFF, not clocked or both. A retention flip-flop typically includes smaller transistor having lower current drive capacity than the transistors in the primary circuit. Thus the circuit state is retained at a lower power cost.

Such a retention flip-flop is often similar to a memory bit cell connected to the retained circuit line. The primary circuit has sufficient current drive capacity to set the state of the retention flip-flop during switching operation. The retention flip-flop retains this state while the primary circuit is turned off.

Recent developments in integrated circuit fabrication have changed the parameters of this engineering compromise. Smaller manufacturing features enable production of integrated circuits with more transistors. This generally supports greater computing power per integrated circuit. This development has led to production of systems on a chip (SOC) for many battery powered equipment. The use of smaller transistors reduces the utility of retention flip-flops. Reduced transistor feature size results in greater relative leakage current. Leakage current flows through a transistor nominally biased OFF. Thus for smaller feature size transistors the retention flip-flops drain a larger share of current relative to the primary circuit than for larger feature size transistors.

The design goal for retention flip-flops in low power SOC designs are: drawing very low leakage current in retention mode; retaining the state when the switchable VDD is powered down; and limited compromise on the active mode timing performance. Conventional existing retention flip-flops employing the lowest leakage transistors having high threshold voltages (HVT) have poor timing performance. Conventional existing retention flip-flops employing standard threshold transistors (SVT) have high retention mode current leakage.

SUMMARY OF THE INVENTION

This invention is a retention circuit retaining the state of a circuit node driven by a primary drive circuit. This circuit includes cross coupled first and second inverters and a transmission gate. The transmission gate receives a retention mode signal and isolates the retention circuit and the circuit node when a retention mode is active and connects the retention circuit and the circuit node when the retention mode is inactive. In the preferred embodiment the primary drive circuit is constructed of transistors having a standard voltage threshold and the retention circuit is constructed of transistors having a high voltage threshold greater than said standard voltage threshold. A tristate inverter isolates the retention circuit from the circuit node when not in retention mode and supplies an inverse of a signal from output of said first inverter when said retention mode signal indicates said retention mode is active.

BRIEF DESCRIPTION OF THE DRAWINGS

These and other aspects of this invention are illustrated in the drawings, in which.

DETAILED DESCRIPTION OF PREFERRED EMBODIMENTS

This invention concerns retention flip-flops used in electronic circuits. It is generally known that low power transistors having small feature sizes and standard voltage thresholds (SVT) also have high leakage current. In advanced SOCs retention flip-flops formed of SVT transistors draw more leakage current than optimal to meet system power goals. Transistors of the same feature size having high voltage thresholds (HVT) generally have acceptable leakage currents but are slower switching. In advanced SOCs retention flip-flops formed of HVT transistors may not meet the system timing goals. Because switching speeds are related to computational performance, SOCs using HVT transistors in retention flip-flops may have lower computational performance.

The retention flip-flop circuit of this invention has similar timing performance as existing retention flip-flops employing all standard voltage threshold ($V_T$) (SVT) transistors. The retention flip-flop circuit of this invention achieves an about seven times reduction in retention mode leakage relative to existing high performance retention flip-flops employing all SVT transistors. This retention flip-flop circuit requires about 20% additional silicon area than existing high performance retention flip-flops employing all SVT transistors. The retention flip-flop of this invention employs a mix of differing voltage threshold transistors to reduce retention mode leakage current without sacrificing timing performance. Achieving timing closure in a digital design employing these retention flip-flops is easier than conventional circuits without sacrificing on standby/leakage power.

Figure 1:
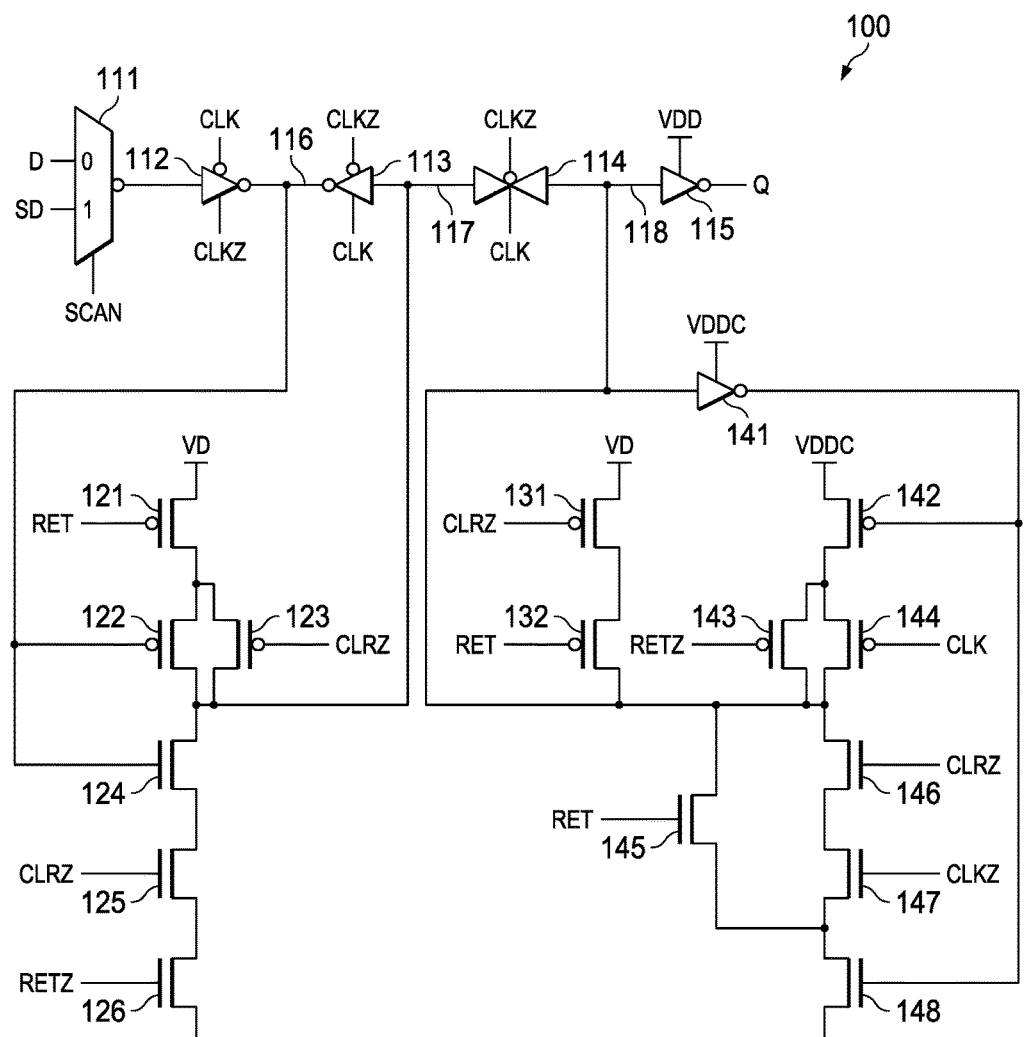
FIG. 1 illustrates a flip-flop circuit having a master latch and a retention slave latch according to the prior art.

FIG. 1 illustrates a circuit 100 of the known art of a retention flip-flop including a master latch and a retention slave latch. Multiplexer 111 selects between a normal input D and a scan input SD as selected by a scan control signal SCAN. As known in the art, many SOC flip-flops are connected in an alternate manner, known as a scan chain, for circuit operational testing. The output of multiplexer 111 drives the input of a tristate inverter 112. Tristate inverter 112 is controlled by an SOC system clock signal CLK and its inverse CLKZ. Tristate inverter 112 is operational during only one phase of the SOC system clock signal CLK. When not operational tristate inverter 112 provides a high impedance at its output.

The output of tristate inverter 112 drives the primary register bit known as a master latch. The master latch is a pair of cross-coupled inverters. The first inverter of the register bit is tristate inverter 113. Tristate inverter 113 is constructed similarly to tristate inverter 112 except tristate inverter 113 is conductive during the opposite phase of SOC system clock signal CLK. The second inverter of the register bit is formed by P-channel transistors 121, 122 and 123, and N-channel transistors 124, 124 and 126.

When tristate inverter 112 is conducting, it supplies an inverted version of the signal selected by multiplexer 111 to node 116. Because of the inverse clocking, tristate inverter 113 is disabled during this interval. The second inverter in the master latch receives an input at the gates of P-channel transistor 122 and N-channel transistor 124 from node 116. These transistors conduct for opposite input digital states. If the signal on node 116 is low, transistor 122 tends to conduct and transistor 124 is cut off. Ignoring momentarily transistors 121, 123, 125 and 126, this tends to drive the output at node 117 high by conduction through transistor 122 to VDD. If the signal on node 116 is high, transistor 122 is cut off and transistor 124 tends to conduct. This tends to drive the output at node 117 low by conduction through transistor 124 to ground. The operation of P-channel transistors 121 and 123 and N-channel transistors 125 and 126 will be further explained below.

Upon change of phase of SOC system clock signal CLK, tristate inverter 112 is turned OFF and tristate inverter 113 is turned ON. Turning ON tristate inverter 113 enables the cross-coupled inverters of the register bit. This latches the state of the register bit. Transmission gate 114 passes the latched bit state at node 117 to node 118. Transmission gate 114 is controlled in the same phase as tristate inverter 113 and is operational during the same clock phase. Inverter 115 supplies the inverse of the state on node 118 to register bit output Q. The opposite clocking of tristate inverters 112 and 113 prevent them from supplying opposing signals at node 116.

The signals RET and RETZ control a RETENTION mode. In this exemplary circuit 100, RET is active high. Thus RET is high and RETZ is low when in retention mode and RET is low and RETZ is high when not in retention mode. Thus when not in retention mode P-channel transistor 121 is ON and N-channel transistor 126 is ON. The register bit operates as outlined above. When in retention mode both P-channel transistor 121 and N-channel transistor 126 are OFF and the register bit is inoperable.

The signal CLRZ controls asynchronous clearing. In the exemplary circuit 100, when CLRZ is low and the circuit 100 is not in retention mode (RET is low), P-channel transistors 121 and 123 are ON and N-channel transistor 125 is OFF. Thus node 117 is connected to VDD via transistors 121 and 123 regardless of the circuit input. Thus CLRZ forces the register bit to a known state corresponding to the clear function.

The retention slave latch of FIG. 1 includes inverter 141, P-channel transistors 131, 132, 142, 143 and 144 and N-channel transistors 145, 146, 147 and 148. The retention slave latch is a pair of cross-coupled inverters. The first inverter of the retention slave latch is inverter 141. The second inverter of the retention slave latch is formed by P-channel transistors 142, 143 and 144, and N-channel transistors 145, 146, 147 and 148. Node 118 drives the input of inverter 141. The output of inverter 141 supplies the gates of P-channel transistor 142 and N-channel transistor 148. If the signal on node 118 is high, then the output of inverter 141 is low, and transistor 142 tends to conduct and transistor 148 is cut off. Ignoring momentarily transistors 143, 144, 146 and 147, this tends to drive the output at node 118 high by conduction through transistor 142 to VDDC. If the signal on node 118 is low, then the output of inverter 141 is high, and transistor 142 tends to be cut off and transistor 148 tends to conduct. This tends to drive the output at node 118 low by conduction through transistor 148 to ground.

Transistors 144 and 147 make the second inverter of the retention slave latch a tristate inverter. When CLK is high, transistor 144 and transistor 147 are both OFF providing a high impedance output. When CLK is low, transistor 144 and transistor 147 are both ON providing an inverter. Thus this second inverter of the retention slave latch is active during only one phase of CLK. This is the same phase as tristate inverter 112 and the opposite phase of tristate inverter 113.

Recall that RET is high and RETZ is low when in retention mode and RET is low and RETZ is high when not in retention mode. Thus when in retention mode both P-channel transistor 143 and N-channel transistor 145 are ON. This bypasses transistor 144 and the serial connection of transistors 146 and 147. When not in retention mode both P-channel transistor 143 and N-channel transistor 145 are OFF. Thus when in retention mode this second inverter of the retention flip-flop is not sensitive to the phase of CLK (transistors 144 and 147) and not sensitive to the asynchronous clear signal CLRZ (transistor 146).

Transistors 131 and 132 place the retention flip-flop in a known state when the asynchronous clear signal CLRZ is active (e.g., low in the illustrated example). When CLRZ is low and RET is low (not in retention mode), both transistors 131 and 132 are ON. This connects VDD to node 118. This is similar to the action of transistors 121 and 123 in the second inverter in the primary register bit. Under these same conditions (CLRZ is low and RET is low), transistors 145 and 146 are both OFF and isolate the second inverter output from ground. This prevents contention between the asynchronous clear and the second inverter output.

The circuit 100 of FIG. 1 includes power supplies of two types. The first power supply VDD may be switched ON or OFF for power consumption control. In FIG. 1, inverters 112, 113 and 115 are typically powered by this switchable power supply VDD. The second power supply VDDC is always ON. In FIG. 1, inverter 141 is powered by this always ON power supply VDDC. FIG. 1 illustrates the second inverter of the master latch and the asynchronous clear circuit of the retention slave latch are powered by switchable power supply VDD. FIG. 1 illustrates the second inverter of the retention slave latch is powered by always ON power supply VDDC.

The circuit of FIG. 1 is known as a clock-free retention architecture. This circuit is clock-free in that it can enter or exit the retention state without regard to the state of the CLK signal.

The terms standard threshold voltage and high threshold voltage are used to designate the relative values of one transistor's threshold voltage versus another transistor's threshold voltage and are not necessarily limiting those terms to certain absolute values. A transistor's threshold voltage is determined by measuring its current-voltage characteristics to determine a gate-to-source voltage where the transistor conducts a small amount of current. A standard threshold voltage transistor (SVT) is a transistor having the most often used (standard) threshold voltage for that semiconductor wafer. A high threshold voltage transistor (HVT) is a transistor having a higher threshold voltage than the standard threshold voltage for that semiconductor wafer.

The embodiments described in this application may be constructed in various manners in order to accomplish different transistors having differing threshold voltages. As a first example, one manner of accomplishing this goal could be using a manufacturing process which specifically permits the creation of logic circuits using transistors having differing threshold voltages. For example, in current technology, typically a single semiconductor area (e.g. a wafer) is masked and the exposed areas are exposed to an implant which establishes the threshold voltage for the exposed transistor channels of a first conductivity type. For example, the $V_T$ of all n-channel transistors may be set by using this process. Repeating this process with a different mask set sets the $V_T$ for all p-channel transistors. Thus, using two implant steps, the $V_T$ is set for both n-channel and p-channel transistors. Additionally, for both conductivity types, the depth and/or concentration of the implant used in this manner affects the level of the threshold voltage resulting from the exposure. The methodology, however, may be expanded to provide at least two different sets of transistors, where both sets have the same conductivity type but one set includes HVT transistors while the other includes SVT transistors. Using this expanded methodology, and for one conductivity type, a first set of masks could be used to create a set of HVT transistors in the appropriate locations while a second set of masks could be used to create a set of SVT transistors in differing locations. Thus, for a given transistor conductivity type, one implant would take place using the first set of masks to create the HVT transistors. Another implant would take place using the second set of masks to create the SVT transistors. Additionally, for the second transistor conductivity type, two more sets of masks and implants would be employed in a like manner. The formation and/or construction of an HVT transistor versus an SVT transistor may be accomplished by other techniques as well. As another example, some transistors are formed using what is known as silicon-on-insulator ("SOI") technology. In this technology, each SOI transistor includes a separate body connection. Typically, the body is either connected to a certain node, or is allowed to float. This separately available connection may be further used to accomplish the relative $V_T$ standards set forth in this application. A person skilled in the art will readily appreciate that a given circuit may be constructed by intentionally specifying differing threshold voltages for different transistors with the choice of either SVT or HVT transistors within a circuit configuration guided by the embodiments set forth in this document.

Known digital circuits with retention slave latches were constructed according to three types. In the first type all transistors are constructed as SVT transistors. This first type provides fast switching but involves large leakage in retention mode. The second type employs all HVT transistors. This second type provides good levels of leakage but is slower switching, which can be problem for the primary register bit. The third type circuit uses transistors of both voltage thresholds. This third type employs SVT transistors for multiplexer 111, transistors 121 through 126, inverters 112, 113 and 115 and transmission gate 114. This third type also employs HVT transistors for transistors 131 and 132, inverter 141 and transistors 142, 143, 144, 145, 145, 147 and 148. This third type provides good switching speed and good levels of leakage.

This invention provides the good switching speed of the third type of the prior art noted above with even lower leakage. In retention mode, the retention slave latch supplied by always ON supply VDDC retains the state. The leakage components from VDDC in retention mode according to the third type noted above includes leakage in retention slave latch transistors. This is where the state is retained. This leakage includes gate leakage and source/drain leakage. The leakage components from VDDC in retention mode in this third type also includes leakage from retention slave latch to the master latch through transmission gate 114. This invention reduces this second prominent source of leakage.

Figure 2:
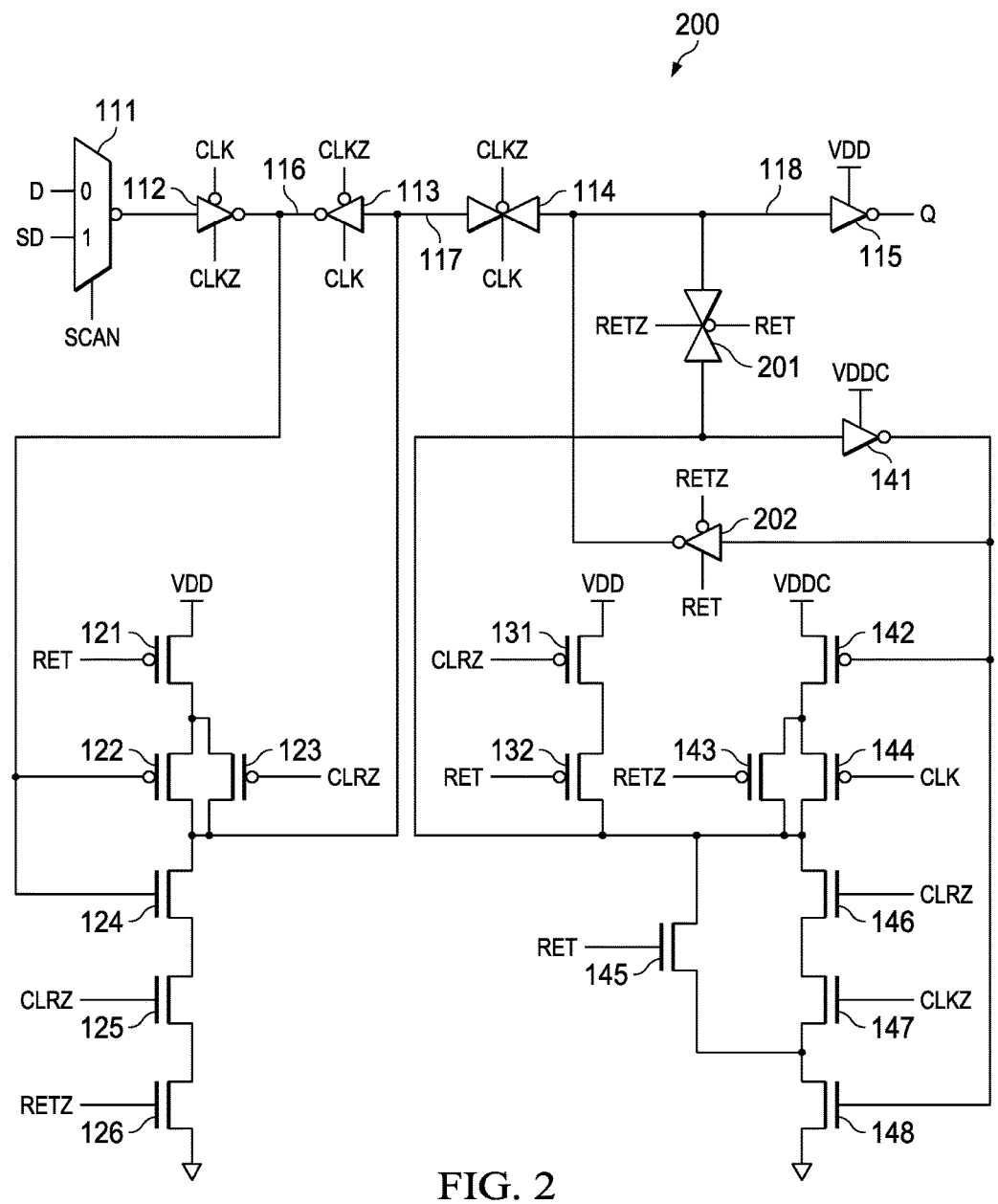
FIG. 2 illustrates a flip-flop circuit having a retention slave latch according to this invention.

FIG. 2 illustrates the retention flip-flop according to this invention. In FIG. 2 the master latch circuit consisting of multiplexer 111, tristate inverter 112, tristate inverter 113, transmission gate 114 and inverter 115, and transistors 121, 122, 123, 124, 124 and 126 are the same as illustrated in FIG. 1. These are all SVT transistors. In FIG. 2 the retention flip-flop components inverter 141, and transistors 131, 132, 142, 143, 144, 145, 146, 147 and 148 are the same as illustrated in FIG. 1. These are all HVT transistors. FIG. 2 illustrates two additional parts. Transmission gate 201 couples node 118 to the input of inverter 141. This differs from the direct connection illustrated in FIG. 1. Transmission gate 201 is controlled by signals RET and RETZ to be conductive when not in retention mode and to isolate node 118 from the input of inverter 141 when in retention mode. Transmission gate 201 is constructed of HVT transistors. The input of tristate inverter 202 is connected to the output of inverter 141. The output of tristate inverter 202 is connected to node 118. Tristate inverter 202 is controlled by signals RET and RETZ to be conductive when in retention mode and to isolate node 118 (tristate) from the output of tristate inverter 141 when not in retention mode. Not illustrated in FIG. 2, tristate inverter 202 is powered from the switchable power supply VDD. Additionally tristate inverter 202 is preferably constructed employing SVT transistors. As an alternative, because tristate inverter 202 is not in a place requiring greatest switching speed, tristate inverter 202 could be constructed employing HVT transistors.

Transmission gate 201 and tristate inverter 202 isolate the retention slave latch from the master latch and source/drain channels of SVT transistors. Thus this circuit provides better (lower) leakage than the prior art. This invention differs from the prior art mixed voltage threshold embodiment in which the primary circuit employs SVT transistors and the retention slave latch employs HVT transistors. That prior art circuit includes an interface between SVT transistors and HVT transistors which suffers high leakage through the source/drain channel of SVT transistors. Transmission gate 201 isolates this interface when in retention mode providing reduced leakage current in retention mode.

Tristate inverter 202 prevents node 118 from floating when in retention mode and CLK is low and VDD is ON. This eliminates the possibility of a shoot through current from VDD to ground through inverter 115. Tristate inverter 202 writes the state of the retention slave latch into the master latch when in retention mode when CLK is high. This is via transmission gate 114 to node 117. This ensures the master latch outputs the correct value when CLK=1.

This invention has the following advantages over the prior art. This invention provides the lowest leakage current in retention mode. This invention provides good timing performance when not in retention mode. Because the circuit of this invention provides the same clock free operation as the prior art, this circuit can be directly substituted for the prior art circuit. The feedback through tristate inverter 202 ensures CLK free retention functionality by writing back from the retention slave latch to the master latch when in retention mode. Tristate inverter 202 also prevents shoot through current in output inverter 115 when in retention modes, CLK is low and VDD is ON. These advantages are achieved by new circuits transmission gate 201 and tristate inverter 202 which add about 20% additional integrated circuit area.

What is claimed is:

1. An integrated circuit comprising:
   a retention circuit configured to retain the state of a circuit node, the retention circuit including:
   a first inverter having an input and an output;
   a second inverter having an input and an output, wherein the input of the second inverter is connected to the output the first inverter and the output of the second inverter is connected to the input of the first inverter;
   a transmission gate having a first terminal connected to the circuit node and a second terminal connected to the input of the first inverter, wherein the transmission gate is configured to be controlled by a retention mode signal that indicates whether a retention mode is active or inactive to isolate the first terminal and the second terminal from each other when the retention mode signal indicates that the retention mode is active and to connect the first terminal and the second terminal to each other when the retention mode signal indicates that the retention mode is inactive; and
   a third inverter having an input and an output, wherein the third inverter is a tristate inverter, wherein the input of the third inverter is connected to the output of the first inverter, wherein the output of the third inverter is connected to the circuit node by a signal path that extends between the output of the third inverter and the circuit node and does not include another inverter, and wherein the tristate inverter is configured to be controlled by the retention mode signal to isolate the output of the third inverter from the circuit node when the retention mode signal indicates that the retention mode is inactive and to supply an output signal to the circuit node when the retention mode signal indicates that the retention mode is active, the output signal supplied by the output of the third inverter being an inverse of an output signal supplied by the output of the first inverter.

2. The integrated circuit of claim 1, comprising a primary drive circuit configured to drive the circuit node, the primary drive circuit being constructed of one or more standard voltage threshold (SVT) transistors.

3. The integrated circuit of claim 2, wherein:
   the first inverter includes one or more high voltage threshold (HVT) transistors, the HVT being greater than the SVT;
   the second inverter includes one or more high voltage threshold (HVT) transistors; and
   the transmission gate includes one or more high voltage threshold (HVT) transistors.

4. The integrated circuit of claim 3, wherein the third inverter includes one or more SVT transistors.

5. The integrated circuit of claim 4, wherein all transistors of the third inverter are SVT transistors.

6. The integrated circuit of claim 3, wherein the third inverter includes one or more HVT transistors.

7. The integrated circuit of claim 6, wherein all transistors of the third inverter are HVT transistors.

8. The integrated circuit of claim 2, wherein all transistors of the primary drive circuit are SVT transistors.

9. The integrated circuit of claim 8, wherein:
   the first inverter includes one or more high voltage threshold (HVT) transistors, the HVT being greater than the SVT;
   the second inverter includes one or more high voltage threshold (HVT) transistors; and
   the transmission gate includes one or more high voltage threshold (HVT) transistors.

10. The integrated circuit of claim 9, wherein all transistors of the first inverter, the second inverter, and the transmission gate are HVT transistors.

11. The integrated circuit of claim 10, wherein the third inverter includes one or more SVT transistors.

12. The integrated circuit of claim 11, wherein all transistors of the third inverter are SVT transistors.

13. The integrated circuit of claim 10, wherein the third inverter includes one or more HVT transistors.

14. The integrated circuit of claim 13, wherein all transistors of the third inverter are HVT transistors.

15. The integrated circuit of claim 1, comprising:
   a primary drive circuit configured to drive the circuit node;
   a first power supply configured to be switchable between on and off states during operation of the integrated circuit, and being configured to power the primary drive circuit; and
   a second power supply configured to be always on during operation of the integrated circuit, and being further configured to power the first inverter, the second inverter, and the transmission gate.

16. The integrated circuit of claim 1, wherein the integrated circuit is a system on a chip (SoC).

17. The integrated circuit of claim 1, wherein the retention circuit is one of a plurality of retention circuits of the integrated circuit forming a scan chain.

* * * * *